(12) United States Patent
Jonsthovel et al.

(10) Patent No.: US 11,536,873 B2
(45) Date of Patent: Dec. 27, 2022

(54) ENHANCED TWO POINT FLUX APPROXIMATION SCHEME FOR RESERVOIR SIMULATION

(71) Applicant: Schlumberger Technology Corporation, Sugar Land, TX (US)

(72) Inventors: Tom Jonsthovel, Houston, TX (US); Terry Wayne Stone, Hampshire (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 536 days.

(21) Appl. No.: 16/328,270

(22) PCT Filed: Sep. 28, 2017

(86) PCT No.: PCT/US2017/054072
§ 371 (c)(1),
(2) Date: Feb. 25, 2019

(87) PCT Pub. No.: WO2018/064366
PCT Pub. Date: Apr. 5, 2018

(65) Prior Publication Data
US 2019/0212469 A1 Jul. 11, 2019

Related U.S. Application Data

(60) Provisional application No. 62/400,727, filed on Sep. 28, 2016.

(51) Int. Cl.
*G01V 99/00* (2009.01)
*G01V 11/00* (2006.01)
(Continued)

(52) U.S. Cl.
CPC ............. *G01V 99/005* (2013.01); *G01V 3/18* (2013.01); *G01V 11/00* (2013.01); *G06F 17/13* (2013.01); *G06F 30/20* (2020.01)

(58) Field of Classification Search
CPC ........ G01V 99/005; G01V 3/18; G01V 11/00; G06F 30/20; G06F 17/13
(Continued)

(56) References Cited

U.S. PATENT DOCUMENTS

| 7,783,883 B2 * | 8/2010 | Gasparini | ............... H04L 63/08 |
| | | | 713/168 |
| 2009/0281776 A1 * | 11/2009 | Cheng | ..................... E21B 49/00 |
| | | | 703/2 |

(Continued)

FOREIGN PATENT DOCUMENTS

WO 2012/071090 A1 5/2012

OTHER PUBLICATIONS

Hassanpour, R. M., et al. "Calculation of permeability tensors for unstructured gridblocks." Journal of Canadian Petroleum Technology 49.10 (2010). pp. 65-74. (Year: 2010).*

(Continued)

*Primary Examiner* — John E Johansen

(57) ABSTRACT

A method for performing a modified two point flux approximation scheme is disclosed. The method includes: obtaining a first pressure value for a first neighbor cell and a second pressure value for a second neighbor cell, where the first neighbor cell has a first value of a reservoir property and the second neighbor cell as a second value of the reservoir property; determining a first weight using the first pressure value and a second weight using the second pressure value; calculating a third value of the reservoir property as a weighted average of the first value and the second value; and applying the third value to the first neighbor cell.

20 Claims, 9 Drawing Sheets

(51) Int. Cl.
*G01V 3/18* (2006.01)
*G06F 30/20* (2020.01)
*G06F 17/13* (2006.01)

(58) Field of Classification Search
USPC .......................................................... 703/10
See application file for complete search history.

(56) References Cited

U.S. PATENT DOCUMENTS

| | | | |
|---|---|---|---|
| 2010/0106472 A1 | 4/2010 | Kaminsky et al. | |
| 2011/0082676 A1* | 4/2011 | Bratvedt | E21B 43/26 703/10 |
| 2013/0035913 A1 | 2/2013 | Mishev et al. | |
| 2013/0231907 A1* | 9/2013 | Yang | G01V 99/005 703/2 |

OTHER PUBLICATIONS

Hoteit, Hussein, and Abbas Firoozabadi. "Numerical modeling of two-phase flow in heterogeneous permeable media with different capillarity pressures." Advances in water resources 31.1 (2008). pp. 56-73. (Year: 2008).*

Castelletto, Nicola, Joshua A. White, and H. A. Tchelepi. "Accuracy and convergence properties of the fixed-stress iterative solution of two-way coupled poromechanics." International Journal for Numerical and Analytical Methods in Geomechanics 39.14 (2015). pp. 1593-1618. (Year: 2015).*

Mlacnik, Martin, Louis J. Durlofsky, and Zoltan E. Heinemann. "Sequentially adapted flow-based PEBI grids for reservoir simulation." Spe Journal 11.03 (2006). pp. 317-327. (Year: 2006).*

Faigle, Benjamin, et al. "Efficient multiphysics modelling with adaptive grid refinement using a MPFA method." Computational Geosciences 18.5 (2014). pp. 625-636. (Year: 2014).*

Potsepaev, Roman, Christopher Leonard Farmer, and A. J. Fitzpatrick. "Multipoint flux approximations via upscaling." SPE Reservoir Simulation Symposium. OnePetro, 2009. pp. 1-8. (Year: 2009).*

Jönsthövel, T. B., and T. W. Stone. "Enhanced Discretization for Improved Stability of Thermal Simulation." SPE Middle East Oil & Gas Show and Conference. OnePetro, 2017. pp. 1-11. (Year: 2017).*

International Preliminary Report on Patentability for the equivalent International patent application PCT/US2017/054072 dated Apr. 11, 2019.

Lee, et al., "Hybrid upwind discretization of nonlinear two-phase flow with gravity," Advances in Water Resources, vol. 82, p. 27-38.

Spillette, et al., "A High-Stability Sequential Solution Approach to Reservoir Simulation," the 48th Annual Fall Meeting of the Society of Petroleum Engineers of AIME, held in Las Vegas, Nev., Sep. 30-Oct. 3, 1973.

International Search Report and Written Opinion for the equivalent International patent application PCT/US2017/054072 dated Jan. 17, 2018.

* cited by examiner

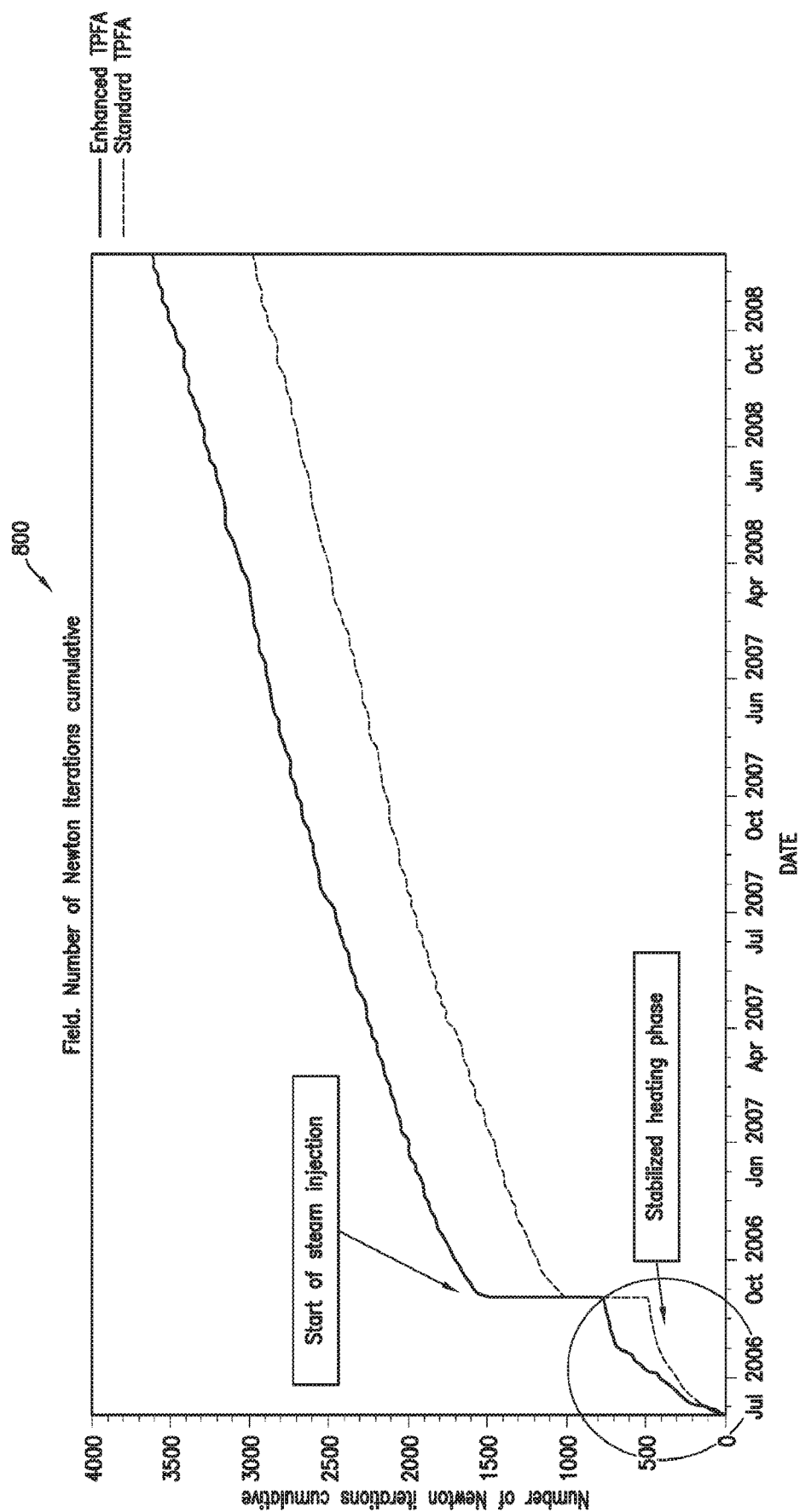

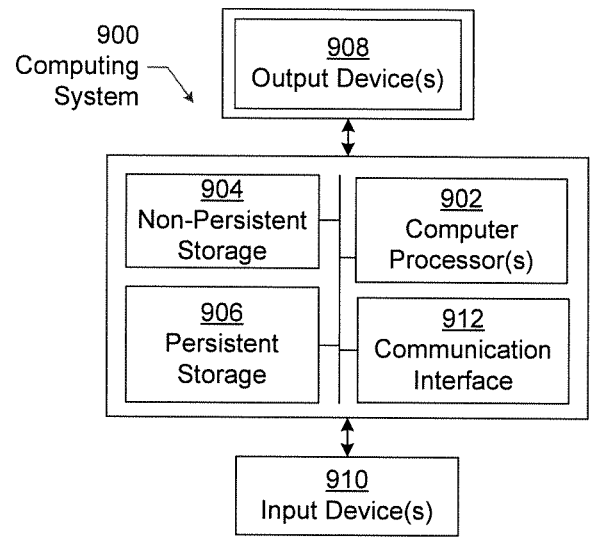
*FIG. 9.1*
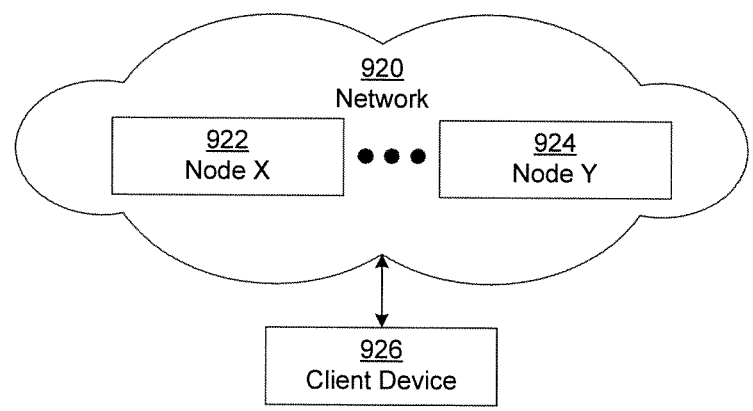
*FIG. 9.2*

ENHANCED TWO POINT FLUX APPROXIMATION SCHEME FOR RESERVOIR SIMULATION

BACKGROUND

Reservoir simulation involves solving a set of non-linear partial differential equations (PDEs) modeling the fluid flow in porous media over a set of time steps. In order to solve the PDEs, the equations are often discretized on a grid of cells.

SUMMARY

In general, one or more embodiments relate to a method for simulation. The method comprises: obtaining a reservoir model generated using a plurality of field measurements; executing a simulation using a modified two point flux approximation scheme; and outputting simulation results.

In general, one or more embodiments relate to a method for performing a modified two point flux approximation scheme. The method comprises: obtaining a first pressure value for a first neighbor cell and a second pressure value for a second neighbor cell, wherein the first neighbor cell has a first value of a reservoir property and the second neighbor cell as a second value of the reservoir property; determining a first weight using the first pressure value and a second weight using the second pressure value; calculating a third value of the reservoir property as a weighted average of the first value and the second value; and applying the third value to the first neighbor cell.

In general, one or more embodiments relate to a non-transitory computer readable medium for simulation. The computer readable medium comprises computer readable program code for: obtaining a reservoir model generated using a plurality of field measurements; executing a simulation using a modified two point flux approximation scheme; and outputting simulation results.

In general, one or more embodiments relate to a non-transitory computer readable medium for performing a modified two point flux approximation scheme. The computer readable medium comprises computer readable program code for: obtaining a first pressure value for a first neighbor cell and a second pressure value for a second neighbor cell, wherein the first neighbor cell has a first value of a reservoir property and the second neighbor cell as a second value of the reservoir property; determining a first weight using the first pressure value and a second weight using the second pressure value; calculating a third value of the reservoir property as a weighted average of the first value and the second value; and applying the third value to the first neighbor cell.

In general, one or more embodiments relate to a computer system for modified two point flux approximation. The computer system comprises: a data repository for storing a plurality of field measurements; a computer processor; and a simulator configured to: obtain a first pressure value for a first neighbor cell and a second pressure value for a second neighbor cell, wherein the first neighbor cell has a first value of a reservoir property and the second neighbor cell as a second value of the reservoir property; determine a first weight using the first pressure value and a second weight using the second pressure value; calculate a third value of the reservoir property as a weighted average of the first value and the second value; and apply the third value to the first neighbor cell.

BRIEF DESCRIPTION OF DRAWINGS

FIGS. 5, 6, 7, and 8 show examples in accordance with one or more embodiments.

FIGS. 9.1 and 9.2 show a computing system in accordance with one or more embodiments.

DETAILED DESCRIPTION

Figure 1:
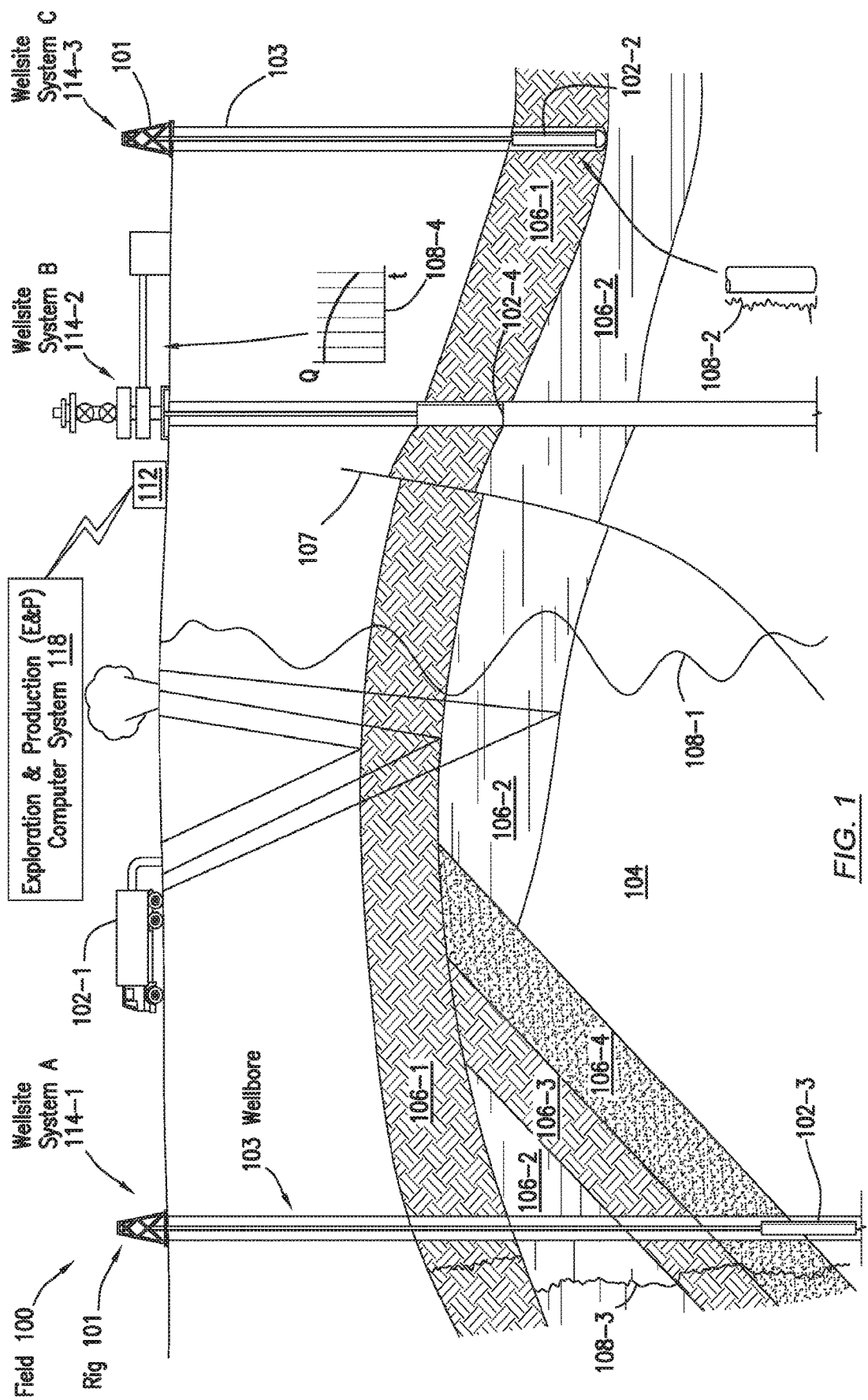
FIGS. 1 and 2 shows system diagrams in accordance with one or more embodiments.

Specific embodiments will now be described in detail with reference to the accompanying figures. Like elements in the various figures are denoted by like reference numerals for consistency.

In the following detailed description of embodiments, numerous specific details are set forth in order to provide a more thorough understanding. However, it will be apparent to one of ordinary skill in the art that embodiments may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments are directed to modifying a two point flux approximation scheme for reservoir simulation in order to increase an efficiency of the simulation on a computer system. In particular, a computer system determines the properties of a subsurface by creating a subsurface model having multiple cells. Each cells corresponds to a location in the subsurface. In other words, the cells represent a partitioning of the subsurface. Simulations are performed on the subsurface model. The simulations may be performed to determine the change in properties over time. A technique for performing the simulations is two point flux approximation. Two point flux approximation determines the flux between two cells based on an assumption of the flow direction between the cells. In other words, based on the flow direction, properties of the reservoir are determined. For example, if cell i is a neighbor of cell j, then the flow direction determines whether the two point flux approximation evaluates the properties in cell i using the properties of cell j or in cell j using the properties of cell i. In certain cases, the flow direction may not be well defined or unknown in actuality or as an erroneous artifact of the simulations. For example, the flow may proceed from cell i to cell j and then from cell j to cell i. An example of when the flow may not be well defined may be in the case of considering thermal variation. In such a scenario, performing two point flux approximation on a computer system may cause extra compute cycles to be performed as the simulator vacillates between whether to use the properties of cell i to evaluate cell j or cell j to evaluate cell i for the same time step. In other words, the two point flux approximation scheme is destabilized in the case in which the flow is indefinite.

One or more embodiments are directed to a modified two point flux approximation scheme. In the modified two point flux approximation scheme, a test is performed to determine whether the flow satisfies a threshold. The flow is determined to satisfy a threshold, when the flow is less than the threshold. If the flow satisfies the threshold, then a weighted averaging of the neighboring cells is performed to determine the reservoir properties of the neighboring cells. In one or more embodiments, the weighted averaging is based on the measurement of the flow.

In particular, one or more embodiments is directed to an improved discretization method to stabilize the Two Point Flux Approximation scheme used in the Finite Volume method and applied to reservoir simulation. The test is based on the magnitude of changes in reservoir properties to identify when to apply the modified discretization method. If the test indicates a potential for destabilization, one or more embodiments perform a modified discretization method in addition to the upstream/upwind discretization method used in the two point flux approximation scheme. The modified discretization method is a weighted average of the existing upstream/upwind discretization method used in the two point flux approximation scheme.

Turning to the Figures, FIG. 1 depicts a schematic view, partially in cross section, of a field (100) in which one or more embodiments may be implemented. In one or more embodiments, one or more of the modules and elements shown in FIG. 1 may be omitted, repeated, and/or substituted. Accordingly, embodiments should not be considered limited to the specific arrangements of modules shown in FIG. 1.

A geologic sedimentary basin includes subterranean formations (104). As shown in FIG. 1, the subterranean formation (104) may include several geological structures (106-1 through 106-4). As shown, the formation may include a shale layer (106-1), a limestone layer (106-2), a sandstone layer (106-3), and another shale layer (106-4). A fault plane (107) may extend through the formation. In particular, the geologic sedimentary basin includes rock formations and at least one reservoir including fluids. In one or more embodiments, the rock formations include at least one seal rock, for example, the shale layer (106-1), which may act as a top seal. In one or more embodiments, the rock formations may include at least one seal rock, for example, the shale layer (106-4), which may act as a bottom seal. In one or more embodiments, various survey tools and/or data acquisition tools are adapted to measure the formation and detect the characteristics of the geological structures of the formation. Generally, survey operations and wellbore operations are referred to as field operations of the field (100). These field operations may be performed as directed by the surface unit (112).

In one or more embodiments, the surface unit (112) is communicatively coupled to the exploration and production (E&P) computer system (118). The E&P computer system may be the computer system described in FIG. 2 and FIGS. 9.1 and 9.2. In one or more embodiments, the data received by the surface unit (112) may be sent to the E&P computer system (118) for further analysis. Generally, the E&P computer system (118) is configured to analyze, model, control, optimize, or perform management tasks of the aforementioned field operations based on the data provided from the surface unit (112). In one or more embodiments, the E&P computer system (118) is provided with functionality for manipulating and analyzing the data, such as performing simulation, planning, and optimization of production operations of the wellsite system A (114-1), wellsite system B (114-2), and/or wellsite system C (114-3). In one or more embodiments, the result generated by the E&P computer system (118) may be displayed for an analyst user to view the result in a 2D display, 3D display, or other suitable displays. Although the surface unit (112) is shown as separate from the E&P computer system (118) in FIG. 1, in other examples, the surface unit (112) and the E&P computer system (118) may also be combined.

Although FIG. 1 shows a field (100) on the land, the field (100) may be an offshore field. In such a scenario, the subterranean formation may be in the sea floor. Further, field data may be gathered from the field (100) that is an offshore field using a variety of offshore techniques for gathering field data.

In one or more embodiments, the data received by the surface unit (112) represents physical properties of the subterranean formation (104) and may include seismic data and/or information related to location of the horizon and fault surfaces or characteristics of the formation rocks like porosity, saturation, permeability, natural fractures, stress magnitude and orientations, elastic properties, etc., during a drilling, fracturing, logging, or production operation of the wellbore (103) at the wellsite system (110).

Figure 2:
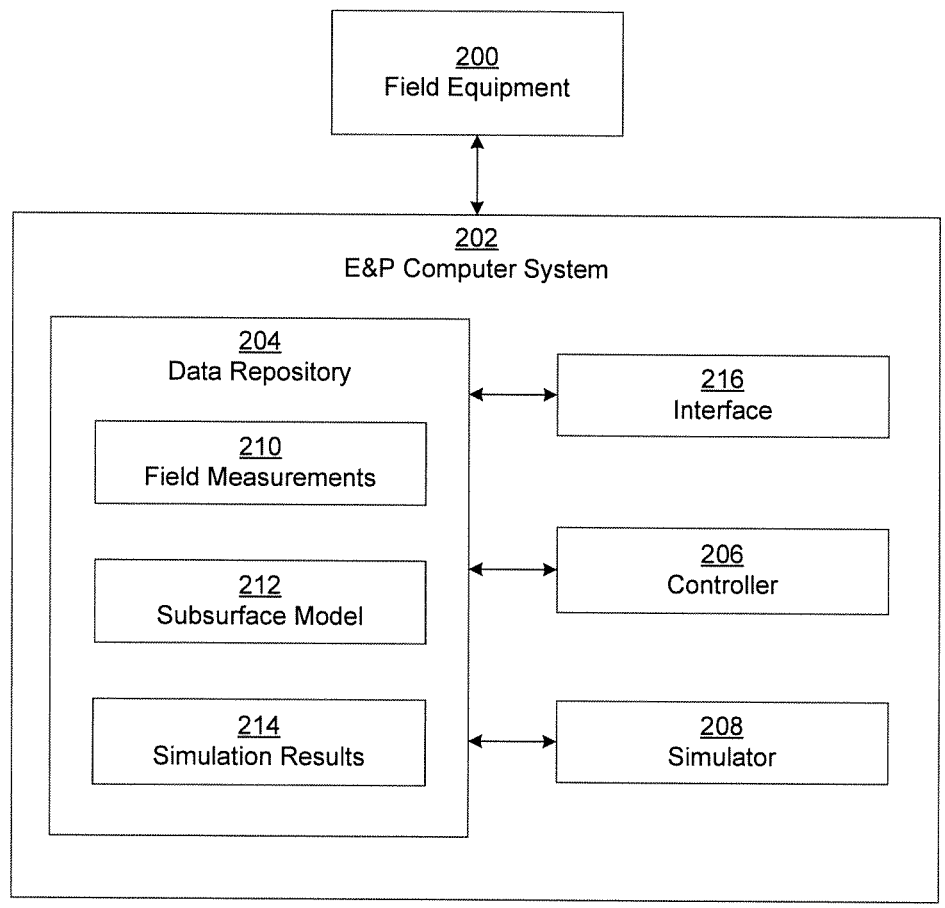

FIG. 2 shows more details of the E&P computer system (118) in which one or more embodiments of the technology may be implemented. In one or more embodiments, one or more of the modules and elements shown in FIG. 2 may be omitted, repeated, and/or substituted. Accordingly, embodiments of evaluation of fluid transport properties in heterogeneous geological formation should not be considered limited to the specific arrangements of modules shown in FIG. 2.

As shown in FIG. 2, the field equipment (200) (e.g., the various equipment shown in FIG. 1) is connected to the E&P computer system (202). The E&P computer system (202) includes a data repository (204), an interface (216), a controller (206), and a simulator (208). Each of these components is described below.

The E&P computer system (202) includes a data repository (204) for storing input data, intermediate data, and resultant outputs of the simulation and analysis. In one or more embodiments, the data repository (240) may include one or more disk drive storage devices, one or more semiconductor storage devices, other suitable computer data storage devices, or combinations thereof. In one or more embodiments, content stored in the data repository (240) may be stored as a data file, a linked list, a data sequence, a database, a graphical representation, any other suitable data structure, or combinations thereof.

In one or more embodiments, the content stored in the data repository (240) includes field measurements (210), a subsurface model (212), and simulation results (214). Each of these components is discussed below.

The field measurements (210) are values of the physical properties of the subsurface elements measured directly in the field or laboratory. In one or more embodiments, at least a portion of the values are based on measurements obtained from the data acquisition tools depicted in FIG. 1 above. For example, field measurements (210) may include measurements obtained from seismic response of the subsurface formations in the oilfield (e.g. seismic travel time), from gravity and magnetic surveys (e.g. gravity field intensity, magnetic field intensity, etc.), from core logs and laboratory tests on core samples (e.g. permeability, natural gamma ray, etc.), from well logs in the wellbores of the oilfield (e.g. spontaneous potential, resistivity, nuclear magnetic resonance, etc.), from production testing of the subsurface formations (e.g. flow rate, fluid properties, temperature, pressure, etc.), etc. Other data may be obtained from the sensors without departing from the scope of the technology.

The subsurface model (212) is a model of a subsurface. The subsurface model may include data related to one or more attributes of the subterranean formations presented in FIG. 1. In one or more embodiments, the subsurface model is partitioned into cells, whereby a cell is a discretization of the subsurface. For example, the cells may be created as a result of a gridding operation on the subsurface model, each grid cell being a cell in the model. Each cell may include, for each property, a value of the property. For example, the properties of the cell may be reservoir properties and rock properties. The rock properties may include, for example, thermal conductivity, porosity, permeability, lithology, age of deposition, and other such properties. The reservoir properties may include flow rate, pressure, temperature, fluid composition, fluid density, fluid viscosity, and other properties. Other properties may be used without departing from the scope of one or more embodiments.

The simulation results (214) are data resulting from simulations on the subsurface model (212). The simulation results (214) may include the flow of fluids through the subsurface, pressure and temperature changes over time expected production, fractures generated from injection operations, and other results.

The interface (216) may corresponds to an application programming interface (API) or graphical user interface (GUI) that provides for a connection to the E&P computer system. For example, the GUI may include functionality to receive input from a user, and present or display numerical and graphical data to the user. The interface (216) may include a three-dimensional (3D) subsurface data viewer, a two-dimensional (2D) subsurface profile viewer, and input fields for entering values for variable parameters in accordance with one or more embodiments. The input fields include functionality to receive input parameters from a user as fixed values or as a range of values. In one or more embodiments, the input fields may include selection boxes, text fields, drop-down menus, or any other type of field for a user to input data.

Although the interface (216) is described with respect to the reservoir simulation, the interface (216) may include additional user interface components for oilfield analysis. For example, the interface (216) may include components for modeling of the oilfield, components for economic evaluation of the oilfield, components for interacting with the oilfield, including sending commands to the oilfield, and other components that are not shown or expressly described above.

The controller (206) is configured to generate a field operation control signal based at least on a result generated by the computer system, such as based on the simulation results. Field equipment depicted in FIG. 1 above may be controlled by the field operation control signal. For example, the field operation control signal may be used to control drilling equipment, an actuator, a fluid valve, or other electrical and/or mechanical devices disposed about the field depicted in FIG. 1 above.

Continuing with FIG. 1, the simulator (208) is a software component that is configured to perform simulations of the physical processes using the subsurface model (212) to generate simulation results. In one or more embodiments, the simulator (208) may include functionality to perform a simulation on a model realization. The model realization may include input parameters for performing the simulation. For example, the input parameters may include properties of injection fluids, locations of a wellbore, and/or other parameters.

In one or more embodiments, the simulator (208) includes functionality to solve a set of non-linear partial differential equations (PDEs) modelling the fluid flow in porous media over a set of time steps. In thermal simulation, the complexity of the PDEs is increased by introducing a temperature dependence in the reservoir properties. Moreover, the high contrast in temperature and pressure at the injection of high temperature fluids may lead to large and sudden discontinuities in the reservoir properties which further increases the nonlinearity of the PDEs. In order to solve the PDEs, the equations are discretized on a grid of cells. The Finite Volume (FV) method and Two Point Flux Approximation (TPFA) are the spatial discretization scheme used in many reservoir simulators. The discretization scheme is known to be very robust but can lead to stability issues when gravity effects as well as sudden and big discontinuities in grid properties are taken into account. For example, thermal simulations tend to suffer from stability issues and as a result thermal simulation is more computationally intensive than iso-thermal simulation. For example, up to 90% of the simulation runtime may be spent in the (nonlinear and linear) solvers. One or more embodiments modify the discretization scheme to handle discontinuities in grid properties. Thus, one or more embodiments may stabilize the discretization scheme, thereby having an improvement in performance of the E&P computer system.

Figure 3:
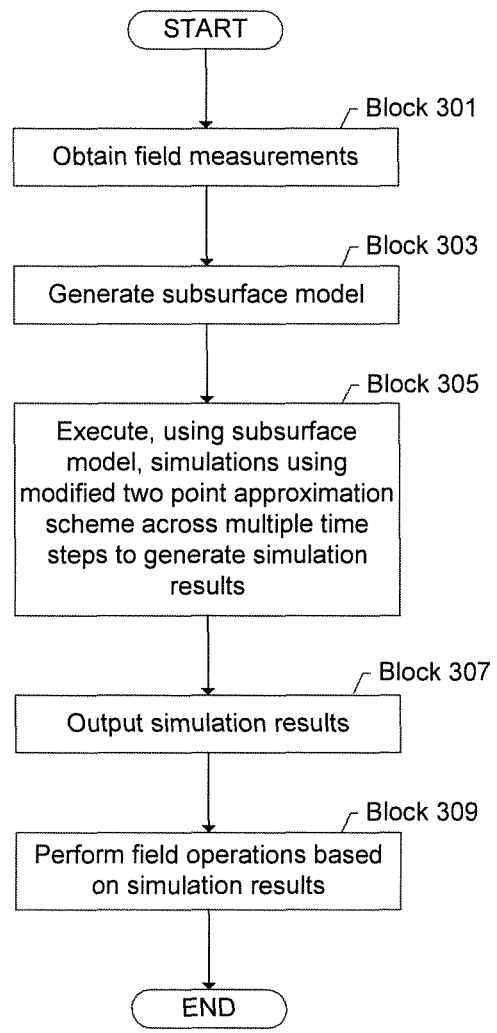
FIGS. 3 and 4 show flowcharts in accordance with one or more embodiments.
Figure 4:
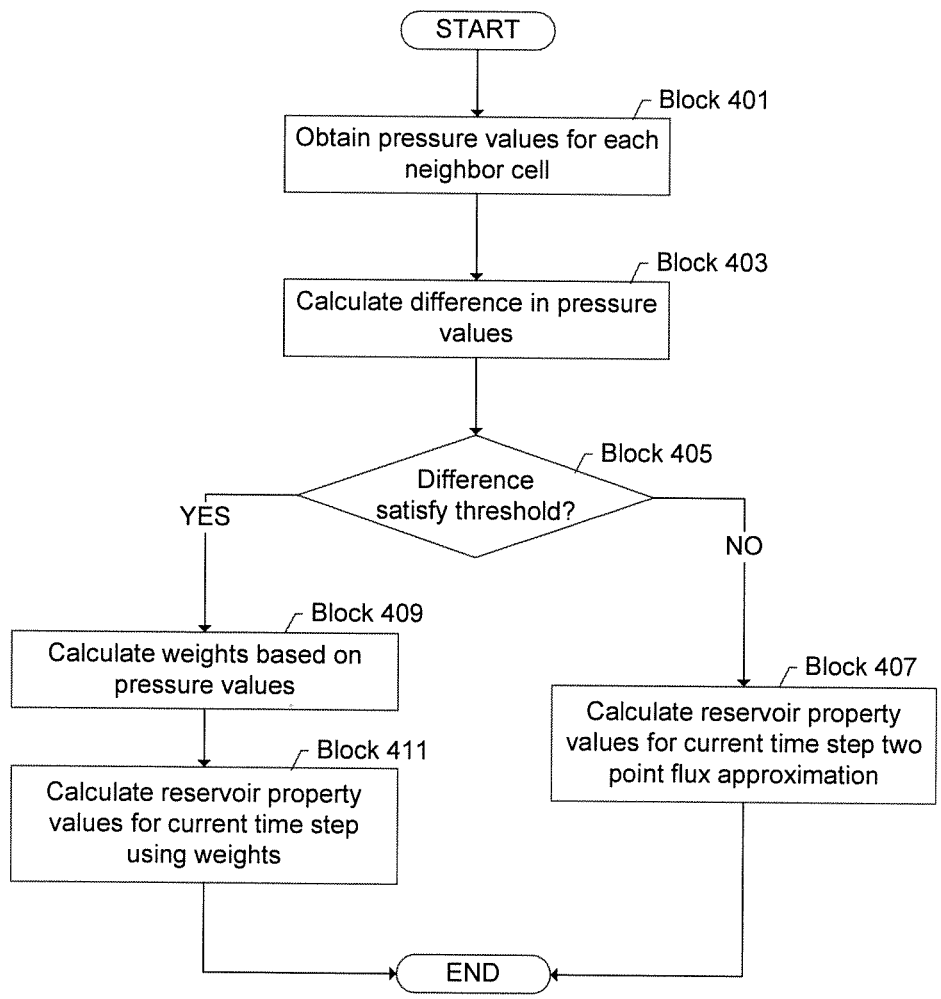

FIGS. 3 and 4 show flowcharts in accordance with one or more embodiments. While the various Blocks in these flowcharts are presented and described sequentially, one of ordinary skill will appreciate that at least some of the Blocks may be executed in different orders, may be combined or omitted, and at least some of the Blocks may be executed in parallel. Furthermore, the Blocks may be performed actively or passively. For example, some Blocks may be performed using polling or be interrupt driven in accordance with one or more embodiments. By way of an example, determination Blocks may not involve a processor processing an instruction unless an interrupt is received to signify that condition exists in accordance with one or more embodiments. As another example, determination Blocks may be performed by performing a test, such as checking a data value to test whether the value is consistent with the tested condition in accordance with one or more embodiments.

In Block 301, field measurements are obtained. For example, the field measurements may be obtained directly or indirectly from various sensors, such as those described above with reference to FIG. 1. For example, the field measurements may be obtained from a data repository populated by the various sensors.

In Block 303, a subsurface model is generated using the field measurements. For example, raw data from the measurements may be processed to generate property values for at least some of the corresponding cells of the subsurface model. Interpolation and other techniques may be performed to generate values for any remaining cells.

In Block 305, using the subsurface model, simulations are executed using a modified two point approximation scheme across multiple time steps to generate simulation results. In one or more embodiments, a simulation that spans multiple time steps is performed based on the set of inputs. Performing the simulation for a time step is discussed below with reference to FIG. 4.

In Block 307, the simulation results are outputted. For example, the simulation results may be stored and/or presented. An analyzer may analyze the simulation results from the different simulations having different inputs to select a set of inputs that have a simulation result matching a set of one or more criterion (e.g., highest production, lowest risk, highest revenue expectation, production within a threshold, costs within a threshold, risk within a threshold, or other criterion).

In Block 309, field operations are performed based on the simulation results in accordance with one or more embodiments. For example, a control signal may be sent to the field equipment to perform drilling and/or production operations according to the set of inputs.

FIG. 4 shows a flowchart for performing a modified two point approximation scheme in accordance with one or more embodiments. In FIG. 4, pressure values are used as the measurement of flow. In particular, because the pressure of neighboring cells may specify the amount and direction of flow at a particular time step, one or more embodiments may use the respective pressure values as an indicator of flow.

In Block 401, pressure values are obtained for each neighboring cell in accordance with one or more embodiments. In other words, for the time step, for two cells that are neighbors (e.g., adjacent to each other), a pressure value is obtained.

In Block 403, the difference in the pressure values is calculated in accordance with one or more embodiments. In Block 405, a determination is made whether the difference satisfies a threshold. In one or more embodiments, a determination is made whether the difference is less than a threshold. If the difference is less than a threshold, then the pressure may be such as to rapidly switch between time steps or unable to definitively define for the current time step. In other words, the direction of the flow may be unknown. In one or more embodiments, the threshold approximately 2 bar or approximately 28 pounds per square inch. Other thresholds may be used, such as 4 bars. Further, the threshold may be configurable based on the performance.

If the difference does not satisfy a threshold, then the reservoir property values, or values of the reservoir properties, for the neighboring cells may be calculated for the current time step using two point flux approximation in Block 407 in accordance with one or more embodiments. In one or more embodiments, the two point flux approximation in Block 407 is standard two point flux approximation.

Returning to Block 405, if the difference satisfies the threshold, then weights are calculated based on the pressure values in Block 409 in accordance with one or more embodiments. In one or more embodiments, the weights are a function of the respective pressures in the neighboring cells. Thus, if the cells have approximately the same values for pressure, then the weights are approximately equal. In contrast, if the cells have a larger difference in pressure values, then the weights are less equal thereby emulating a possible flow from one cell to another cell.

In Block 411, the reservoir property values are calculated using the weights for the current time step in accordance with one or more embodiments. In one or more embodiments, the reservoir property values are a weighted average of the reservoir property values of the respective cells. Further, in one or more embodiments, each of the two neighboring cells in Block 401 may have the same reservoir property values calculated in Block 411 in accordance with one or more embodiments. In other words, for the current time step, the same reservoir property values may be store for both cells in accordance with one or more embodiments.

In one or more embodiments, at the end of the current time step, the reservoir property values may be stored and used for the next time step. FIG. 4 may repetitively be performed until the end of the simulation. For example, the simulation may end when equilibrium is reached, after a defined number of time steps, or another metric is achieved.

Although FIG. 4 presents the modified two point flux approximation scheme as considering two cells at a time, more than two cells may be considered without departing from the scope.

The examples shown in FIGS. 5, 6, 7, and 8 and the following description are for explanatory purposes and not intended to limit the scope of one or more embodiments. In one or more embodiments, the simulation is a sequence of time steps. At each time step, the nonlinear flow equations are solved using an iterative method up to a predefined precision. The flow equations model the flow of hydrocarbons in porous media and may be based on the Darcy Flow equations. The flow equations are discretized in space using the finite volume method, using a two point flux approximation. The discretized flow equations use phase pressure as an independent variable. Further, the ability for a fluid (independent of the phase) to flow through a facet between two grid cells is expressed as the transmissibility which is a function of the cell geometry and the constant permeability of the medium.

Figure 5:
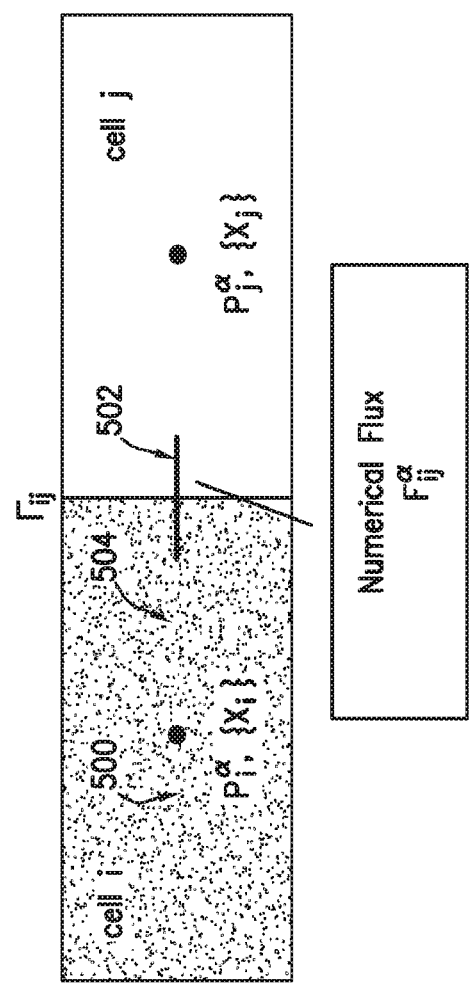

Turning to FIG. 5, consider two neighboring cells i (500) and j (502) between which a fluid in phase α flows through facet $\Gamma_{ij}$ (504). The magnitude of the flow is derived from the discretized Darcy flow equation and is referred to as the numerical flux. The numerical flux of a fluid in phase α flowing between cells i and j may be defined as the following function.

$$F_{ij}^\alpha(T_{ij}, g_i(P_i^\alpha, \{X_i\}), g_j(P_j^\alpha, \{X_j\}) \Phi_{ij}^\alpha(P_i^\alpha, P_j^\alpha))$$

In the above function, constant $T_{ij}$ represents the transmissibility through facet $\Gamma_{ij}$. The function $g_i(P_i^\alpha, \{X_i\})$ is an aggregation of fluid properties such as mobility (quotient of relative permeability and fluid viscosity) and density of cell i as a function of phase pressure $P_i^\alpha$ and a set of other variables $\{X_i\}$. The set of other variables may be, for example, the reservoir properties, with the exception of pressure represented by P. The fluid phase pressure potential between cells i and j is given as $\Phi_{ij}^\alpha$ and is a function of phase pressure $P_i^\alpha$ and $P_j^\alpha$.

Conditional stable discretization scheme for reservoir simulation is obtained by evaluating the fluid properties in the direction of the flow which in turn is determined by the pressure gradient between two cells. The flow direction of the fluid between two cells is referred to as the upstream direction. Without loss of generality, this concept can be formulated using equation (Eq. 1) below.

$$F_{ij}^\alpha = \begin{cases} T_{ij} g_i(P_i^\alpha, \{X_i\}) \Phi_{ij}^\alpha(P_i^\alpha, P_j^\alpha), & \Phi_{ij}^\alpha(P_i^\alpha, P_j^\alpha) \geq 0 \\ T_{ij} g_j(P_j^\alpha, \{X_j\}) \Phi_{ij}^\alpha(P_i^\alpha, P_j^\alpha), & \Phi_{ij}^\alpha(P_i^\alpha, P_j^\alpha) < 0 \end{cases} \quad \text{(Eq. 1)}$$

As shown in Eq. 1, if the phase pressure potential between cells i and j is larger than or equal to zero, the flow direction is from i to j and the fluid properties used in the flux function are evaluated at cell i.

The two point flux approximation with upstreaming scheme may be unstable if the phase pressure potential is close to zero and if the flow direction has changed from nonlinear iteration to iteration. In such a scenario, the numerical flux using upstreaming is continuous but the first derivative is discontinuous. As general nonlinear solution methods often use derivatives to define a search direction to construct a solution to the nonlinear equations, any discontinuities in the derivatives may pose a problem for the stability of the general nonlinear solution methods. In particular, the search directions would abruptly change for a small perturbation in the 'discontinuous' zones. An example of the discontinuity is shown in FIG. 6.

Figure 6:
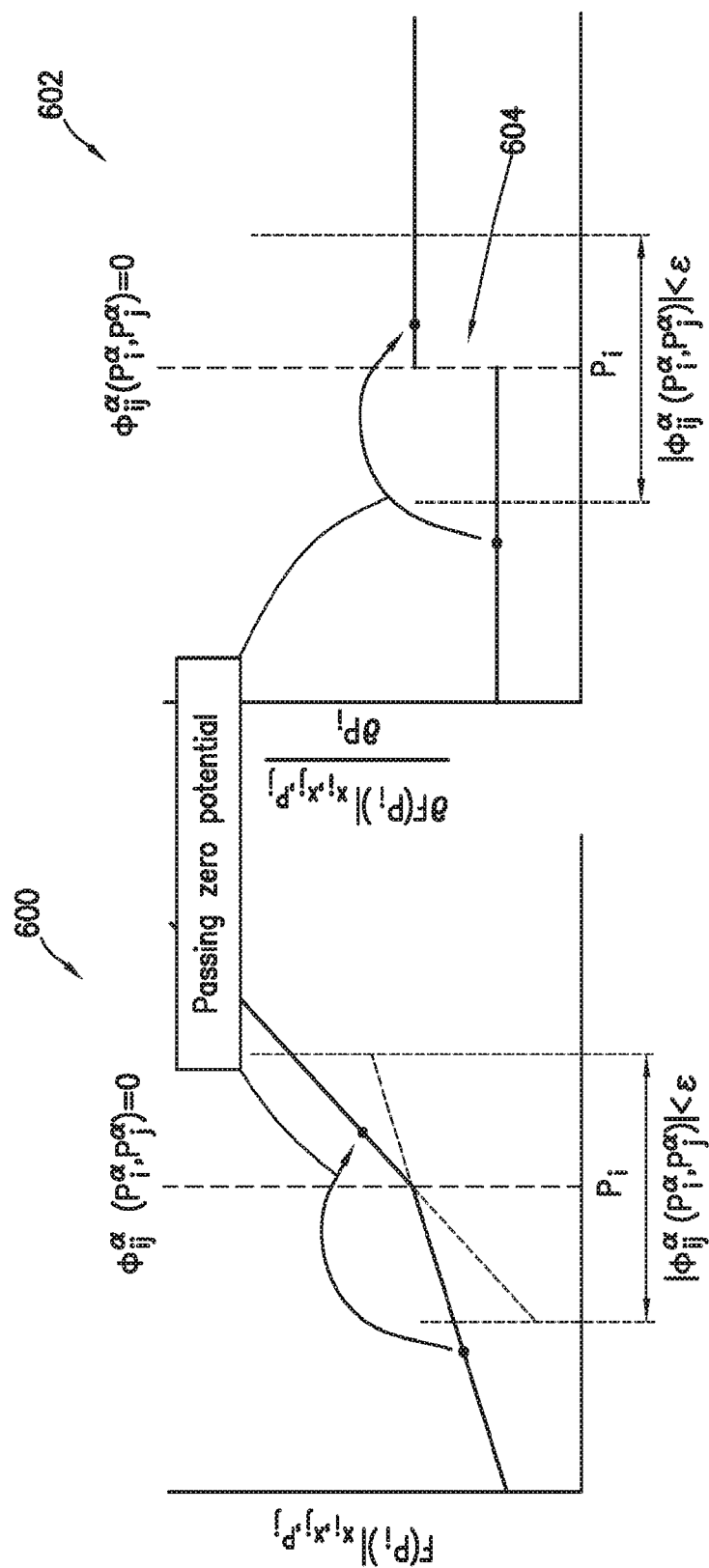

In FIG. 6, the numerical flux between cells i and j is shown in the left part (600) and the derivative of the numerical flux against the phase pressure $P_i$ of cell i is shown in the right part (602). The kink (604) in the flux function represents the zero phase potential, i.e. phase pressure $P_i$ in cell i is equal to phase pressure $P_j$ in cell j. If the search starts from the left of the kink, e.g. a distance $\delta P_i$ away, and a step of $2 * \delta P_i$ to the right is taken, the derivative would jump disproportionally to the change in solution. As a result of the jump in the derivative, the nonlinear solver will struggle to find the right path of convergence and will jump between the right and left side of the curve without ever reaching a converged solution.

Thus, by way of a physical interpretation of FIG. 6, for cells i and j, it is unclear what the real flow direction will be. The two cells are trying to find an equilibrium in phase pressure and, the finding the equilibrium involves temporarily pressure 'spikes' in both cells causing the direction of flow to change.

The general concept of the modified two point flux approximation scheme with weighted upstreaming is the introduction of a third approximation of the numerical flux. The third approximation is performed in the 'discontinuous' zone under certain circumstances. A mathematical formulation of the modified two point flux approximation and test is presented below and in equations (Eq. 2, Eq. 3, Eq. 4, Eq. 5).

$$F_{ij}^\alpha = \begin{cases} T_{ij} g_i(P_i^\alpha, \{X_i\}) \Phi_{ij}^\alpha(P_i^\alpha, P_j^\alpha), & \Phi_{ij}^\alpha(P_i^\alpha, P_j^\alpha) \geq 0 \wedge \neg C_{disc} \\ T_{ij} \left( \begin{array}{c} \gamma_i g_i(P_i^\alpha, \{X_i\}) + \\ \gamma_j g_j(P_j^\alpha, \{X_j\}) \end{array} \right) \Phi_{ij}^\alpha(P_i^\alpha, P_j^\alpha), & C_{disc} \\ T_{ij} g_j(P_j^\alpha, \{X_j\}) \Phi_{ij}^\alpha(P_i^\alpha, P_j^\alpha), & \Phi_{ij}^\alpha(P_i^\alpha, P_j^\alpha) < 0 \wedge \neg C_{disc} \end{cases} \quad \text{(Eq. 2)}$$

in which, $$\gamma_i + \gamma_j = 1 \quad \text{(Eq. 3)}$$

$$\gamma_i = \frac{P_i^\alpha}{P_i^\alpha + P_j^\alpha}, \gamma_j = \frac{P_j^\alpha}{P_i^\alpha + P_j^\alpha} \quad \text{(Eq. 4)}$$

and, $$C_{disc} = \begin{cases} \text{true,} & |\Phi_{ij}^\alpha| < 2 \text{ bar} \wedge \Phi_{ij}^\alpha \Phi_{ij}^{\alpha,*} < 0 \\ \text{false,} & \text{else} \end{cases} \quad \text{(Eq. 5)}$$

In the above equations (Eq. 2, Eq. 3, Eq. 4, Eq. 5), $\Phi_{ij}^{\alpha,*}$ represents the phase pressure potential of the previous nonlinear iteration. As shown, the modified two point flux approximation scheme with weighted upstreaming defaults to the existing two point flux approximation scheme with upstreaming when condition $C_{disc}$ is equal to false. The condition is a test to verify if the solution is in a 'discontinuous' zone and has two parts. First, the condition verifies whether the solution is close the zero phase potential, as a close to zero phase potential increases the likelihood of passing through the zero phase potential. As shown in the example, a range of 2 bar may be used, as 2 bar has shown the most stable results over a wide range of simulation. However, the modified two point flux approximation scheme may become very unstable if the weighting is applied when in the 'discontinuous' zone. The main reason for the instability is that averaging fluid properties does not allow for finding a unique flow direction. A unique flow direction should exist when pressures are in equilibrium. Hence, the second part of the test is performed to verify whether the flow direction has changed from iteration to iteration. The weighting is applied if the flow direction changes from iteration to iteration and the solution is close to a zero phase potential.

The choice of the weights is to use the phase pressures as weights. The main reason lies again in physics. As the phase pressure between cells is finding an equilibrium, the phase pressure in the cells might spike from iteration to iteration. These spikes have a big implication on the numerical method as a spike in pressure may introduce a volatile phase that could disappear as soon as the pressure drops. By using the actual pressures as weights, this effect is dampened.

Figure 7:
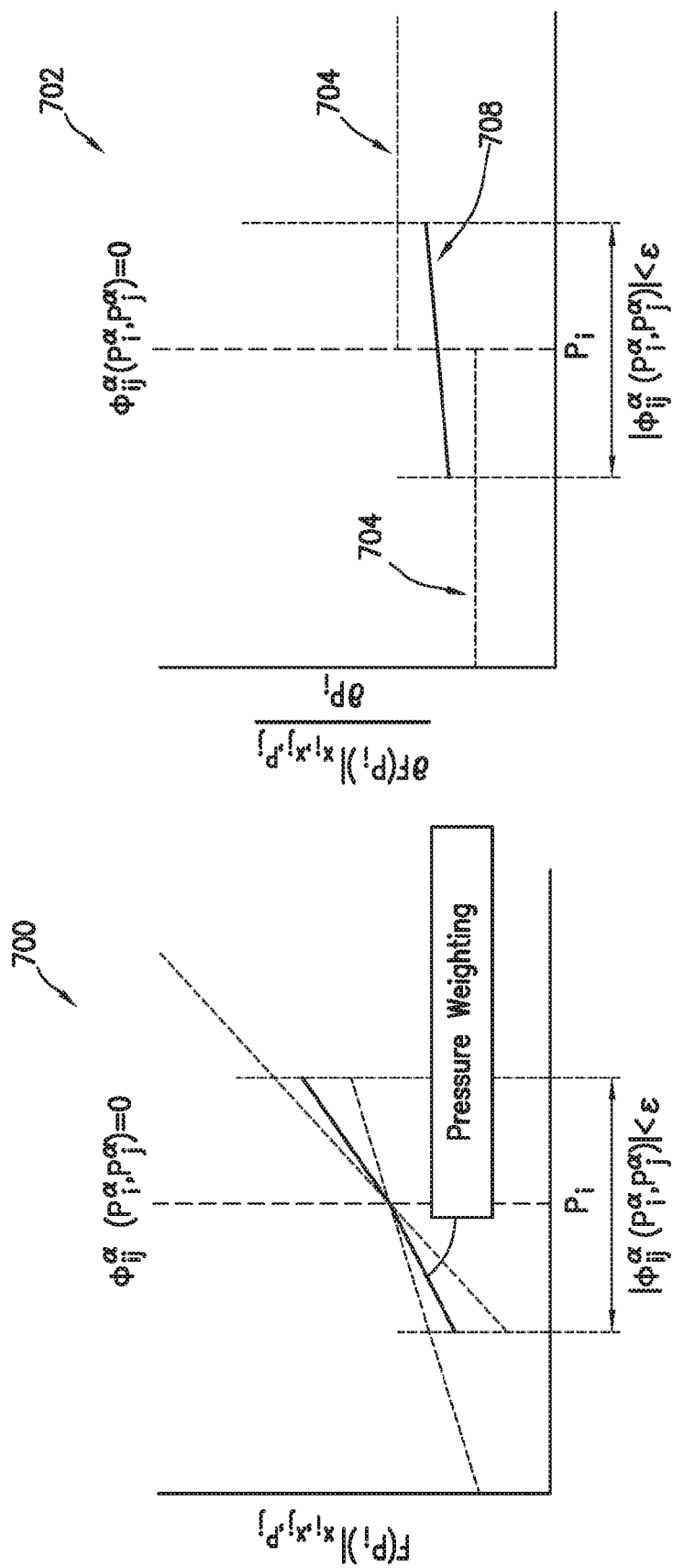

FIG. 7 shows an example of a modified two point flux approximation scheme. In FIG. 7, the graph on the left (700) shows the numerical fluxes between cells i and j. The graph on the right (702) shows the derivatives of the numerical fluxes against the phase pressure $P_i$ of cell i for different scenarios. The dotted line (704) represents the default two point flux approximation scheme. The bold line (708) represents the modified two point flux approximation scheme. As shown, when the simulation starts from left of the 'discontinuous' zone and move into the zone, right from the zero phase potential, the jump in derivatives is less abrupt. When, in the next iteration, the search stays in the zone, the flux would be evaluated using the default two point flux approximation scheme because, in that scenario, an established stable flow direction is expected.

One or more embodiments may be applied to thermal simulations. In many thermal simulations, the hydrocarbons in place are predominantly viscous. As such, the hydrocarbons are difficult to produce. By stimulation of the reservoir, e.g. by injecting hot steam, the viscosity of the fluids is reduced, allowing for production of the hydrocarbons. Simulated thermal field operations include Steam Assisted Gravity Drainage (SAGD) having two stages. In the first stage, the reservoir is heated using heating elements in the wells. In the second stage, steam/water is injected, and hydrocarbons with reduced viscosity are produced by gravity drainage, pulling the fluids down into the producing wells at the bottom of the reservoir. Other operations include Cyclic Steam Stimulation (CSS) where cycles of steam/water injection followed by a soak period followed by a producing period rely on outflow of high enthalpy fluids into the reservoir during injection, conductive heating and producing utilizing a pressurized formation to back-produce oil and other fluids. Another operation is a simple steam drive where a vertical steam/water injector provides high enthalpy steam and a pressurized formation around the injector to drive heated, mobilized oil and other fluids towards a vertical producer.

The stimulation stages may each be difficult to simulate, but for different reasons. In a field operation with a conductive heating phase, heat is conducted through the reservoir which leads to slide imbalances of phase pressures, causing flip-flopping of the flow directions and non-converging time steps. In a phase with steam injection, at the so called steam front (where the hot steam meets the 'cold' reservoir) phases are very volatile resulting in local discontinuities and high nonlinearities in fluid properties which causes the nonlinear solver to chop to very small time steps. In a gravity drainage phase, the driving force is the gravity effect, which leads to countercurrent flow between phases and instable flow directions.

The modified two point flux approximation scheme improves the phases, especially for the conductive and gravity drainage phases. FIG. 8 shows a graph (800) showing the cumulative number of nonlinear iterations of thermal SAGD simulation. The simulation is for roughly 2 million cells with 2 hydro carbon components (methane, bitumen) and 9 horizontal injection and production wells and has 1 cycle with conductive heating and steam injection/gravity drainage phases described above.

When the time steps are small or when the time step size is cut, the number of nonlinear iterations per time step is high. As such, a spike in the cumulative number of nonlinear iterations is shown. Thus, as shown in FIG. 8, the default two point flux approximation scheme with upstreaming has issues in the first (heating) phase starting from time zero to September 2006. However, the modified two point flux approximation scheme does not exhibit the issues and shows a relatively stable number of nonlinear iterations per time step.

Embodiments may be implemented on a computing system. Any combination of mobile, desktop, server, router, switch, embedded device, or other types of hardware may be used. For example, as shown in FIG. 9.1, the computing system (900) may include one or more computer processors (902), non-persistent storage (904) (e.g., volatile memory, such as random access memory (RAM), cache memory), persistent storage (906) (e.g., a hard disk, an optical drive such as a compact disk (CD) drive or digital versatile disk (DVD) drive, a flash memory, etc.), a communication interface (912) (e.g., Bluetooth interface, infrared interface, network interface, optical interface, etc.), and numerous other elements and functionalities.

The computer processor(s) (902) may be an integrated circuit for processing instructions. For example, the computer processor(s) may be one or more cores or micro-cores of a processor. The computing system (900) may also include one or more input devices (910), such as a touchscreen, keyboard, mouse, microphone, touchpad, electronic pen, or any other type of input device.

The communication interface (912) may include an integrated circuit for connecting the computing system (900) to a network (not shown) (e.g., a local area network (LAN), a wide area network (WAN) such as the Internet, mobile network, or any other type of network) and/or to another device, such as another computing device.

Further, the computing system (900) may include one or more output devices (908), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (902), non-persistent storage (904), and persistent storage (906). Many different types of computing systems exist, and the aforementioned input and output device(s) may take other forms.

Software instructions in the form of computer readable program code to perform embodiments may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments.

The computing system (900) in FIG. 9.1 may be connected to or be a part of a network. For example, as shown in FIG. 9.2, the network (920) may include multiple nodes (e.g., node X (922), node Y (924)). Each node may correspond to a computing system, such as the computing system shown in FIG. 9.1, or a group of nodes combined may correspond to the computing system shown in FIG. 9.1. By way of an example, embodiments may be implemented on a node of a distributed system that is connected to other nodes. By way of another example, embodiments may be implemented on a distributed computing system having multiple nodes, where each portion may be located on a different node within the distributed computing system. Further, one or more elements of the aforementioned computing system (900) may be located at a remote location and connected to the other elements over a network.

Although not shown in FIG. 9.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (922), node Y (924)) in the network (920) may be configured to provide services for a client device (926). For example, the nodes may be part of a cloud computing system. The nodes may include functionality to receive requests from the client device (926) and transmit responses to the client device (926). The client device (926) may be a computing system, such as the computing system shown in FIG. 9.1. Further, the client device (926) may include and/or perform all or a portion of one or more embodiments.

The computing system or group of computing systems described in FIGS. 9.1 and 9.2 may include functionality to perform a variety of operations disclosed herein. For example, the computing system(s) may perform communication between processes on the same or different system. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object.

The client process then transmits the connection request to the server process. Depending on availability, the server process may accept the connection request, establishing a communication channel with the client process, or the server process, busy in handling other operations, may queue the connection request in a buffer until server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope. The processes may be part of the same or different application and may execute on the same or different computing system.

Rather than or in addition to sharing data between processes, the computing system performing one or more embodiments may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments, may extract one or more data items from the obtained data. For example, the extraction may be performed as follows by the computing system in FIG. 9.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail-such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 9.1, while performing one or more embodiments, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 9.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 9.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions present a few examples of functions performed by the computing system of FIG. 9.1 and the nodes and/or client device in FIG. 9.2. Other functions may be performed using one or more embodiments.

While the modified two point flux approximation scheme has been described with respect to a limited number of embodiments, those skilled in the art, having benefit of this disclosure, will appreciate that other embodiments can be devised which do not depart from the scope as disclosed herein. Accordingly, the scope should be limited by the attached claims.

What is claimed is:

1. A method comprising:
   obtaining a plurality of field measurements;
   generating a digital reservoir model based on the plurality of field measurements and a gridding operation that assigns the plurality of field measurements to a plurality of cells defined for the digital reservoir model;
   executing, using the digital reservoir model, a plurality of simulations to generate a plurality of simulation results, wherein each of the plurality of simulations comprises a corresponding set of inputs that are different amongst the plurality of simulations, and wherein, for each simulation in the plurality of simulations, executing comprises:
      obtaining a first pressure value for a first neighbor cell of the plurality of cells and a second pressure value for a second neighbor cell of the plurality of cells, wherein the first neighbor cell has a first value of a reservoir property of the digital reservoir model and the second neighbor cell has a second value of the reservoir property;
      determining a first weight using the first pressure value and a second weight using the second pressure value;
      testing whether a difference between the first pressure value and the second pressure value satisfies a threshold,
      generating a simulation result of the plurality of simulation results by:
         responsive to the threshold being satisfied, calculating a third value of the reservoir property as a weighted average of the first value of the reservoir property and the second value of the reservoir property, and applying the third value of the reservoir property to the first neighbor cell; or
         responsive to the threshold failing to be satisfied, calculating a fourth value of the reservoir property using a two point flux approximation scheme, and applying the fourth value to the first neighbor cell; and
   selecting, from the corresponding set of inputs of the plurality of simulations, a selected set of inputs that correspond to a particular simulation result of the plurality of simulation results, wherein the particular simulation result matches one or more criterion, and wherein selecting is performed by an analyzer that takes, as input, at least the plurality of simulation results, and generates, as output, the selected set of inputs.

2. The method of claim 1, further comprising:
   applying the third value of the reservoir property to the second neighbor cell.

3. The method of claim 1, further comprising:
   testing whether a flow direction between the first neighbor cell and the second neighbor cell has changed between at least two iterations, wherein the calculating the third value of the reservoir property as a weighted average is performed based on the flow direction changing.

4. The method of claim 1, wherein determining the first weight using the first pressure value and the second weight using the second pressure value comprises calculating the first weight and the second weight as a function of the first pressure value and the second pressure value.

5. The method of claim 1, wherein the set of inputs comprise one of a property of an injection fluid and a location of a wellbore.

6. The method of claim 1, wherein the one or more criterion comprise at least one of a highest production, a lowest risk, a highest revenue expectation, a production within a second threshold, a cost within a third threshold, and a risk within a fourth threshold.

7. The method of claim 1, further comprising: performing a field operation based on the selected set of inputs.

8. The method of claim 1, wherein the first weight and the second weight comprise phase pressures between the first neighbor cell and the second neighbor cell.

9. A non-transitory computer readable medium comprising computer readable program code which, when executed on a computer, performs a computer-implemented method comprising:
obtaining a plurality of field measurements;
generating a digital reservoir model based on the plurality of field measurements and a gridding operation that assigns the plurality of field measurements to a plurality of cells defined for the digital reservoir model;
executing, using the digital reservoir model, a plurality of simulations to generate a plurality of simulation results, wherein each of the plurality of simulations comprises a corresponding set of inputs that are different amongst the plurality of simulations, and wherein, for each simulation in the plurality of simulations, executing comprises:
obtaining a first pressure value for a first neighbor cell of the plurality of cells and a second pressure value for a second neighbor cell of the plurality of cells, wherein the first neighbor cell has a first value of a reservoir property of the digital reservoir model and the second neighbor cell has a second value of the reservoir property;
determining a first weight using the first pressure value and a second weight using the second pressure value;
testing whether a difference between the first pressure value and the second pressure value satisfies a threshold,
generating a simulation result of the plurality of simulation results by:
responsive to the threshold being satisfied, calculating a third value of the reservoir property as a weighted average of the first value of the reservoir property and the second value of the reservoir property, and applying the third value of the reservoir property to the first neighbor cell; or
responsive to the threshold failing to be satisfied, calculating a fourth value of the reservoir property using a two point flux approximation scheme, and applying the fourth value to the first neighbor cell; and
selecting, from the corresponding set of inputs of the plurality of simulations, a selected set of inputs that correspond to a particular simulation result of the plurality of simulation results, wherein the particular simulation result matches one or more criterion, and wherein selecting is performed by an analyzer that takes, as input, at least the plurality of simulation results, and generates, as output, the selected set of inputs.

10. The non-transitory computer readable medium of claim 9, further comprising computer readable program code for:
applying the third value of the reservoir property to the second neighbor cell.

11. The non-transitory computer readable medium of claim 9, further comprising computer readable program code for:
testing whether a flow direction between the first neighbor cell and the second neighbor cell has changed between at least two iterations,
wherein the calculating the third value of the reservoir property as a weighted average is performed based on the flow direction changing.

12. The non-transitory computer readable medium of claim 9, wherein determining the first weight using the first pressure value and the second weight using the second pressure value comprises calculating the first weight and the second weight as a function of the first pressure value and the second pressure value.

13. The non-transitory computer readable medium of claim 9, wherein:
the set of inputs comprise one of a property of an injection fluid and a location of a wellbore; and
the one or more criterion comprise at least one of a highest production, a lowest risk, a highest revenue expectation, a production within a second threshold, a cost within a third threshold, and a risk within a fourth threshold.

14. The non-transitory computer readable medium of claim 9, further comprising computer readable program code for:
performing a field operation based on the selected set of inputs.

15. The non-transitory computer readable medium of claim 9, wherein the first weight and the second weight comprise phase pressures between the first neighbor cell and the second neighbor cell.

16. A computer system comprising:
a data repository for storing a plurality of field measurements;
a computer processor;
a simulator configured, when executed by the computer processor, to:
obtain the plurality of field measurements;
generate a digital reservoir model based on the plurality of field measurements and a gridding operation that assigns the plurality of field measurements to a plurality of cells defined for the digital reservoir model;
execute, using the digital reservoir model, a plurality of simulations to generate a plurality of simulation results, wherein each of the plurality of simulations comprises a corresponding set of inputs that are different amongst the plurality of simulations, and wherein, for each simulation in the plurality of simulations, executing comprises:
obtaining a first pressure value for a first neighbor cell of the plurality of cells and a second pressure value for a second neighbor cell of the plurality of cells, wherein the first neighbor cell has a first value of a reservoir property of the digital reservoir model and the second neighbor cell has a second value of the reservoir property;

determining a first weight using the first pressure value and a second weight using the second pressure value;

testing whether a difference between the first pressure value and the second pressure value satisfies a threshold, and generating a simulation result of the plurality of simulation results by:

responsive to the threshold being satisfied, calculating a third value of the reservoir property as a weighted average of the first value of the reservoir property and the second value of the reservoir property, and applying the third value of the reservoir property to the first neighbor cell; or responsive to the threshold failing to be satisfied, calculating a fourth value of the reservoir property using a two point flux approximation scheme, and applying the fourth value to the first neighbor cell; and an analyzer configured, when executed by the processor, to select, from the corresponding set of inputs of the plurality of simulations, a selected set of inputs that correspond to a particular simulation result of the plurality of simulation results, wherein the particular simulation result matches one or more criterion, and wherein the analyzer takes, as input, at least the plurality of simulation results, and generates, as output, the selected set of inputs.

17. The computer system of claim 16, the simulator is further configured for:

testing whether a flow direction between the first neighbor cell and the second neighbor cell has changed between at least two iterations, wherein the calculating the third value of the reservoir property as a weighted average is performed based on the flow direction changing.

18. The computer system of claim 16, wherein:

the set of inputs comprise one of a property of an injection fluid and a location of a wellbore; and the one or more criterion comprise at least one of a highest production, a lowest risk, a highest revenue expectation, a production within a second threshold, a cost within a third threshold, and a risk within a fourth threshold.

19. The computer system of claim 16, wherein the system further comprises:

a controller for performing a field operation based on the selected set of inputs.

20. The computer system of claim 16, wherein the first weight and the second weight comprise phase pressures between the first neighbor cell and the second neighbor cell.

* * * * *